United States Patent
Burgett

(10) Patent No.: US 9,356,571 B2
(45) Date of Patent: May 31, 2016

(54) EARBUDS AND EARPHONES FOR PERSONAL SOUND SYSTEM

(71) Applicant: Harman International Industries, Incorporated, Stamford, CT (US)

(72) Inventor: Seth D. Burgett, Glen Carbon, IL (US)

(73) Assignee: Harman International Industries, Incorporated, Stamford, CT (US)

( * ) Notice: Subject to any disclaimer, the term of this patent is extended or adjusted under 35 U.S.C. 154(b) by 309 days.

(21) Appl. No.: 13/734,085

(22) Filed: Jan. 4, 2013

(65) Prior Publication Data

US 2013/0188804 A1 Jul. 25, 2013

Related U.S. Application Data

(60) Provisional application No. 61/583,176, filed on Jan. 4, 2012.

(51) Int. Cl.
*H03G 3/02* (2006.01)
*H04R 5/02* (2006.01)
*H03G 5/02* (2006.01)
*H04S 3/00* (2006.01)

(52) U.S. Cl.
CPC ............... *H03G 3/02* (2013.01); *H03G 5/025* (2013.01); *H04R 5/02* (2013.01); *H04S 3/00* (2013.01)

(58) Field of Classification Search
None
See application file for complete search history.

(56) References Cited

U.S. PATENT DOCUMENTS

| | | | |
|---|---|---|---|
| 7,065,219 B1 | 6/2006 | Abe et al. | 381/74 |
| 7,190,795 B2 * | 3/2007 | Simon | A61B 5/121 |
| | | | 381/60 |
| 7,841,445 B2 * | 11/2010 | Berk et al. | 181/131 |
| 7,903,825 B1 | 3/2011 | Melanson | |
| 8,041,066 B2 * | 10/2011 | Solum | 381/370 |
| 8,082,376 B2 | 12/2011 | Schubert et al. | 710/105 |
| 8,243,942 B2 * | 8/2012 | Grandt | 381/71.6 |
| 8,477,955 B2 * | 7/2013 | Engle et al. | 381/71.1 |
| 8,611,554 B2 * | 12/2013 | Short et al. | 381/74 |
| 8,682,010 B2 * | 3/2014 | Macours | 381/310 |
| 8,712,083 B2 * | 4/2014 | Solum | 381/315 |
| 8,718,295 B2 * | 5/2014 | Sung et al. | 381/74 |
| 8,737,653 B2 * | 5/2014 | Woods | 381/317 |
| 8,767,973 B2 * | 7/2014 | Andrea et al. | 381/71.11 |
| 8,818,000 B2 * | 8/2014 | Andrea | 381/74 |
| 2006/0205349 A1 | 9/2006 | Passier et al. | 455/41.2 |

(Continued)

OTHER PUBLICATIONS

International Preliminary Report on Patentability for PCT/US2013/020227 Dated: Jul. 8, 2014 pp. 8.

(Continued)

*Primary Examiner* — Brian Miller
(74) *Attorney, Agent, or Firm* — Brooks Kushman P.C.

(57) ABSTRACT

A personal sound system includes a portable electronic device that provides an analog audio signal to an audio output; an earphone system, connected by wire to the audio output, the portable electronic device, the earphone system including at least one earphone speaker; at least one control associated with the earphone system, the at least one control wirelessly linked to the portable electronic device so that operation of the at least control adjusts the balance between two or more frequency components of the analog audio signal provided to the at least one earphone.

20 Claims, 4 Drawing Sheets

(56) References Cited

U.S. PATENT DOCUMENTS

2006/0280051 A1\* 12/2006 Petrella .................. H03G 5/025
 369/30.6
2008/0044040 A1\* 2/2008 Werner et al. ................. 381/111
2009/0074206 A1 3/2009 Bradford et al.
2011/0142156 A1 6/2011 Haartsen ....................... 375/271
2014/0056450 A1\* 2/2014 Semcken ...................... 381/309

OTHER PUBLICATIONS

Written Opinion of the International Searching Authority Dated: Mar. 18, 2013 pp. 7.
International Search Report Dated: Mar. 18, 2013 p. 1.
Extended European Search Report, Application No. EP13733743, dated Jul. 14, 2015.

\* cited by examiner

EARBUDS AND EARPHONES FOR
PERSONAL SOUND SYSTEM

CROSS-REFERENCE TO RELATED APPLICATIONS

This application claims the benefit of U.S. Provisional Application No. 61/583,176, filed on Jan. 4, 2012. The entire disclosure of the above application is incorporated herein by reference.

FIELD

The present disclosure relates to earbuds and earphones for personal sound system.

BACKGROUND

This section provides background information related to the present disclosure which is not necessarily prior art.

Personal sound systems are ubiquitous, including dedicated devices like mp3 players such, as the iPod® and multipurpose devices like smart phones, such as the iPhone®. Some of these systems provide no ability to adjust the audio output other than the volume. Other of these systems allow the user to adjust the frequency response, either in high and low bands (bass and treble), or over multiple frequency ranges. These adjustments can be built into the hardware or implemented by software. However, for active users, such as runners, bikers, and swimmers, operating hardware or software controls on the device is difficult at best, and possibly dangerously distracting at worst.

SUMMARY

This section provides a general summary of the disclosure, and is not a comprehensive disclosure of its full scope or all of its features.

Embodiments of the present invention provide a personal sound system which allows a user to quickly and easily adjust the frequency response of a personal sound system. In some preferred embodiments adjustments can be made even when the user is engaged in strenuous activity.

A preferred embodiment of a personal sound system in accordance with the principles of this invention is provided that comprises a portable electronic device that provides an audio signal to an audio output and an earphone system connected by wire to the audio output of the portable electronic device, the earphone system including at least one earphone speaker. There is at least one control associated with the earphone system that is wirelessly linked to the portable electronic device, so that operation of the at least one control can be used to adjust the gains of two or more frequency components of the audio signal delivered to the earphone speaker.

The control may include one or more buttons or switches on the earphone system that cause signals to be sent wirelessly to the portable electronic device. These signals can cause the portable electronic device to change the audio output signal provided to the earphones. Alternatively, these signals can operate a program running on the portable electronic device which sends signals back to the control to modify the signal provided to the user via the at least one earphone speaker. The control may also include a microphone that causes a signal corresponding to a spoken signal to be sent wirelessly to the portable electronic device. These signals can cause the portable electronic device to change the audio output signal provided to the earphones. Alternatively, these signals can operate a program running on the portable electronic device which sends signals back to the control to modify the signal provided to the user via the at least one earphone speaker.

In some embodiments, the at least one control selects among two or more preset balances of two or more frequency components of the audio signal provided to the user at the earphone speakers. For example, these preset balances can be balances specifically adapted for particular genres of music. Alternatively some or all of these present balances can be saved presets of the user's personal preferences.

If the portable electronic device has a display, the display can visually provide information about the adjustment being made. For example, the display can list a menu of preset balances, or display treble and base indicators, or indicators for a plurality of frequency ranges. The display can indicate to the user what is being adjusted and the current level.

In some embodiments, operation of the control causes the portable electronic device to generate an audible signal cuing the user to the adjustment being made, without need to refer to the portable electronic device display. In other embodiments, a return signal from the portable electronic device can cause the control to generate an audible signal cuing the user to the adjustment being made.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
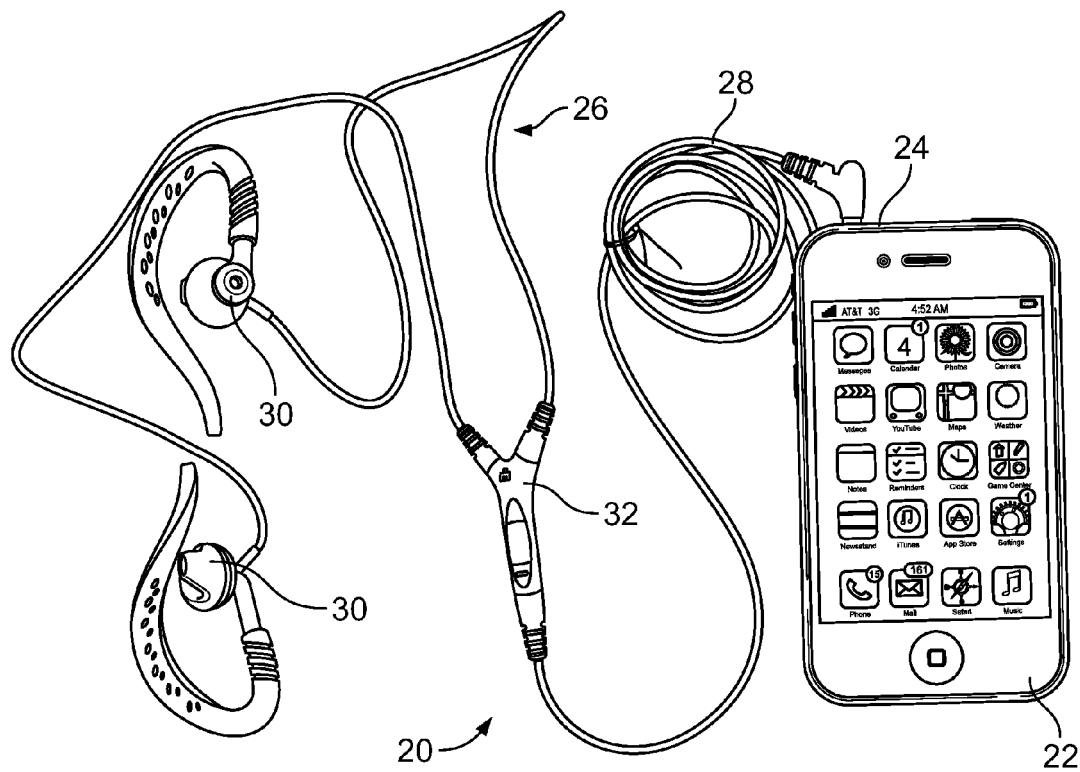
FIG. 1 is a schematic view of a preferred embodiment of a personal sound system, according to the principles of this invention.
Figure 2:
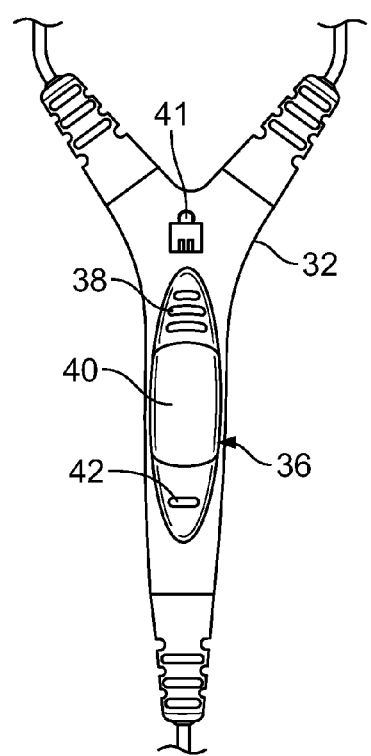
FIG. 2 is an enlarged view of the controller of the personal sound system of FIG. 1.

A preferred embodiment of a personal sound system in accordance with the principles of this invention is indicated generally as 20 in FIG. 1. The system 20 preferably includes a portable electronic device 22 that provides an audio signal to an audio output 24. This portable electronic device 22 may be an iPhone®, as shown, in which case the audio output 24 is the headset jack at the top of iPhone®. Of course, the portable electronic device 22 could be some other type of phone incorporating an mp3 player, such as iPhone®, an htc Amaze™®, a Samsung Galaxy™®, a Motorola Droid®, or other phone. The portable electronic device 22 could also be a dedicated music device, such as an iPod®, a Zune HD®, a SanDisk Sansa Clip Zip®, a Sony Walkman®, or some other type of device, such as a tablet, such as an Apple iPad®, the Samsung Sliding PC 7®, the Motorola Xoom®, the Barnes and Noble Nook®, the Asus Eee Pad®, the BlackBerry PlayBook®, or the HP Touch®.

The personal sound system also comprises an earphone system 26, connected by wire 28 to the audio output 24 of the portable electronic device 22. The earphone system 26 includes at least one and preferably two earphone speakers 30. There is at least one control 32 associated with the earphone system 26 that is preferably wirelessly linked to the portable electronic device 22, so that operation of the at least one control 32 can be used to adjust the sound delivered to the earphone signals. This adjustment can occur by the portable electronic device 22, adjusting the signal that is provided to the audio output 24, or it can occur for example, in the control 32 which alters the signal from the audio output 24 of the portable electronic device 22 before transmitting it to the earphone speakers 30.

The control 32 may be one or more buttons or switches that cause signals to be sent wirelessly to the portable electronic device 22. These signals from the control 32 can cause the portable electronic device 22 to change the audio signal provided to audio output 24, and thus, to the earphone system 26. Alternatively, these signals from the control 32 can operate a program (for example an app) running on the portable electronic device 22, which sends signals back to the control 32, to cause the control 32 to modify the signal received from audio output 24 before providing it to the earphone speakers 30. The signals from the portable electronic device 22 back to the control 32 are preferably transmitted wirelessly, but could also be transmitted within the audio signal provided to the audio output 24.

The wireless signals between the control 32 and the portable electronic device 22 use the Bluetooth® short range wireless connectivity standard, and preferably Bluetooth® technology, and more preferably Bluetooth LE® technology. The control 32 can be powered with a battery or other storage device. In a first alternative, the control 32 is powered by a motion generator; in a second alternative, the control 32 is powered by the mechanical action of operating the buttons and switches on the control; and in a third alternative, the control 32 is powered by a portion of the audio signal provided by the audio output 24 of the portable electronic device 22.

The control 32 can have a wide variety of buttons and switches, but the control is preferably small, lightweight, and easy to operate. To this end, in a preferred embodiment, the control has a single three position toggle switch 36. The switch 36 has three operating positions, an "up" position 38, "center" position 40, and a "down" position 42. In this preferred embodiment, the user can simply press the center position 40 to change the sound signal property that can be adjusted, and then press either the up position 38 or the down position 42 to increase or decrease the selected sound signal property, or to scroll up and down through a plurality of options.

For example, if the user wants to adjust the treble or the bass of the audio signal that he or she is receiving through the earphone speakers 30, the user could press the center position 40 of the switch 36, this generates a wireless signal from the control 32 to the portable electronic device 22. This signal causes a program (app) running on the portable electronic device to change the signal property that the user can adjust, for example, from "volume" to "treble". Subsequent pressing of the "up" position 38 or the "down" position 42 of the switch 36 increases or decreases the treble portion of the signal. This can either be by the program (app) running on the portable electronic device 22 changing the audio signal as it is provided to the audio output 24, or it can be by the control 32 changing the audio signal provided to the earphone speakers 30 in response to a signal generated by the program running on the portable electronic device 22.

Once the user has adjusted the treble as desired, the user can press the center position 40 of the switch 36, this generates a wireless signal from the control 32 to the portable electronic device 22. This signal causes a program (app) running on the portable electronic device 22 to change the signal property that the user can adjust, for example, from "treble" to "bass". Subsequent pressing of the "up" position 38 or the "down" position 42 of the switch 36 increases or decreases the bass component of the signal. This can either be by the program (app) running on the portable electronic device 22 changing the audio signal as it is provided to the audio output 24, or it can be by the control 32 changing the audio signal provided to the earphone speakers 30 in response to a signal generated by the program running on the portable electronic device 22.

Once the user has adjusted the bass as desired, the user could press the center position 40 of the switch 36, this generates a wireless signal from the control 32 to the portable electronic device 22. This signal causes a program (app) running on the portable electronic device 22 to change the signal property that the user can adjust, for example, from "bass" to some other property, which could be adjusted in the same manner by pressing the "up" position 38 or the "down" position 42 of the switch 36. By pressing the center portion 40, the user can scroll the control back to "volume". Alternatively, the system can default back to volume mode after a predetermined time (e.g., ten seconds), so that pressing the "up" position 38 or the "down" position 42 will change the volume, the most frequent user adjustment.

In addition to, or instead of treble and bass adjustments, the system can provide for adjustments for more or different frequency ranges. Rather than adjustment of frequency ranges, the system can be used to select among preset adjustments for particular genres of music, for example, "classical", "jazz", "rock", "heavy metal", etc. Some of these presets can even be user-defined. The user can reach these presets by pressing the center position 40 of the switch 36, this generates a wireless signal from the control 32 to the portable electronic device 22. This signal causes a program (app) running on the portable electronic device to change the signal property that the user can adjust, for example, from "volume" to "presets". Subsequent pressing of the "up" position 38 or the "down" position 42 of the switch 36 scrolls through the list of presets. This can either be by the program (app) running on the portable electronic device 22 changing the audio signal as it is provided to the audio output 24, or it can be by the control 32 changing the audio signal provided to the earphone speakers 30 in response to a signal generated by the program (app) running on the portable electronic device 22.

Figure 4:
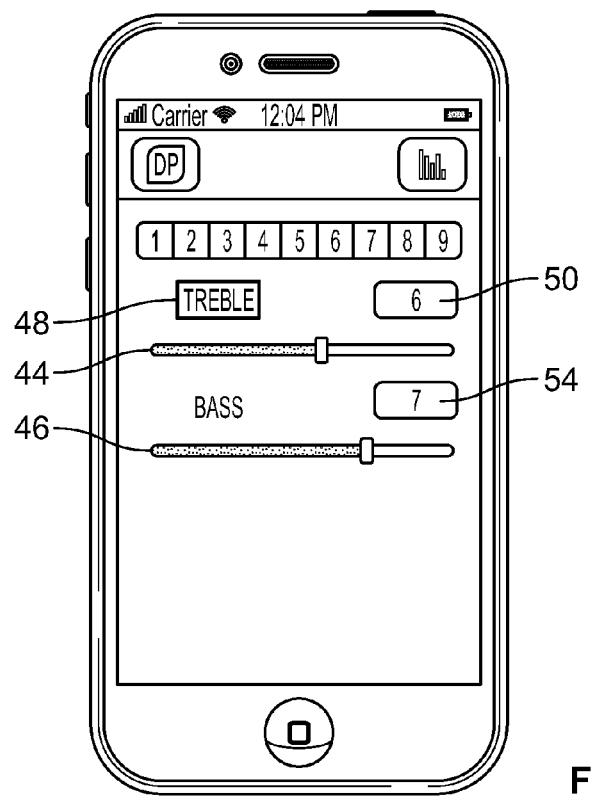
FIG. 4 is a diagram of an exemplary display that might be displayed by a portable electronic device, in accordance with the principles of this invention.

If the portable electronic device 22 has a visual display, the display can provide information about the adjustment being made. For example as shown in FIG. 4, the display can include a treble indicator 44 and a bass indicator 46 for indicating the levels of each frequency band. An indicator for example, a box 48, indicates which of the two frequency bands is being adjusted. Pressing the "up" position 38 or the "down" position 42 of the switch 36 increases or decreases the level of selected treble frequency, which is shown both on the sliding scale indicator 44 and the numeric window 50. Similarly, when the bass frequency band is selected by pressing the center position 40 of the switch 36, pressing the "up" position 38 or the "down" position 42 of the switch 36 increases or decreases the level of selected bass frequency, which is shown both on the sliding scale indicator 46 and the numeric window 54.

Figure 5:
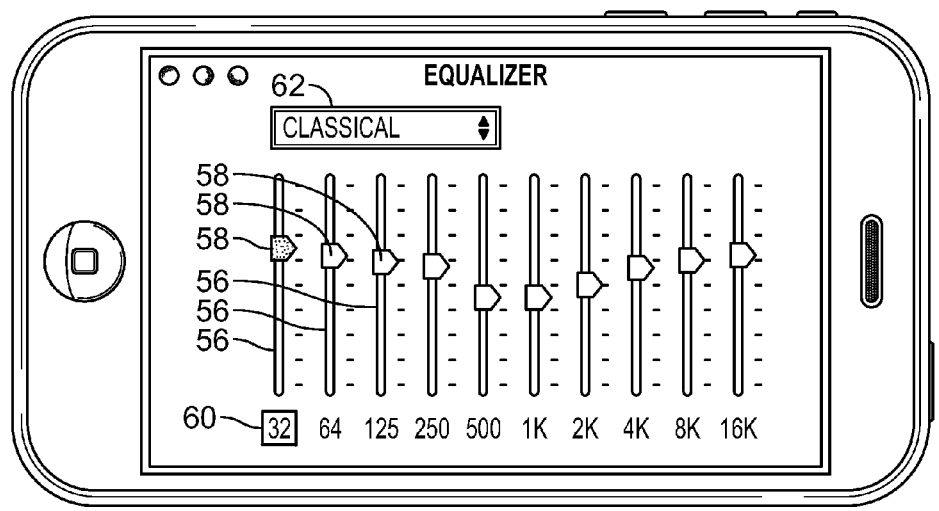
FIG. 5 is a diagram of an exemplary display that might be displayed by a portable electronic device, in accordance with the principles of this invention.
Figure 6:
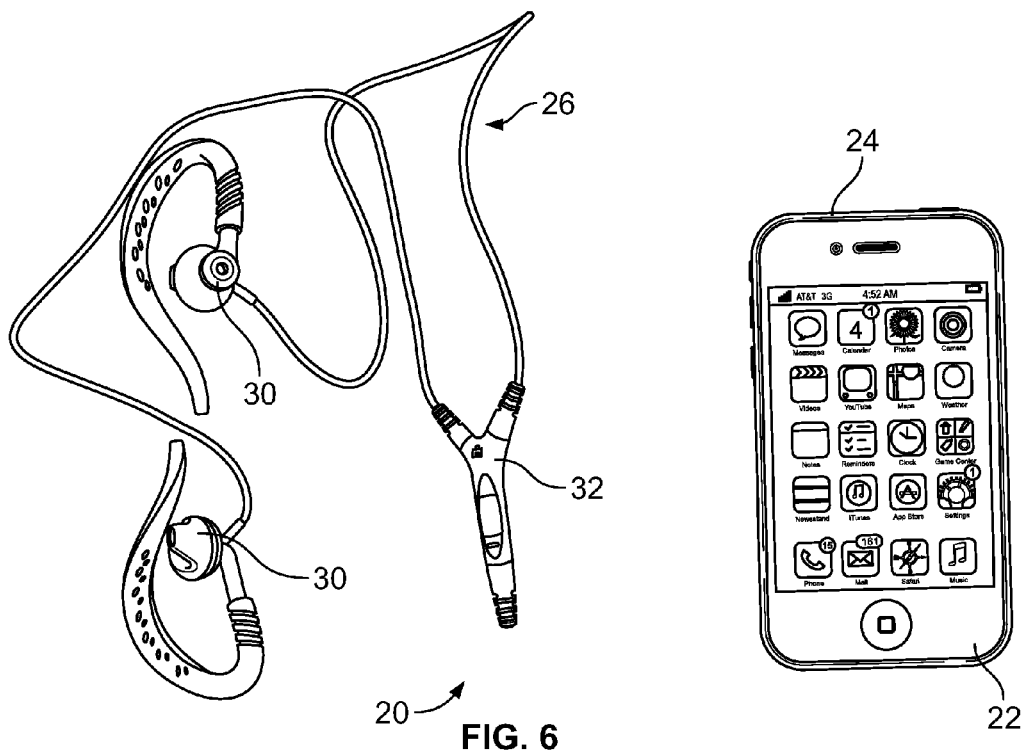
FIG. 6 is schematic view of the wirelessly linked personal sound system.
Figure 7:
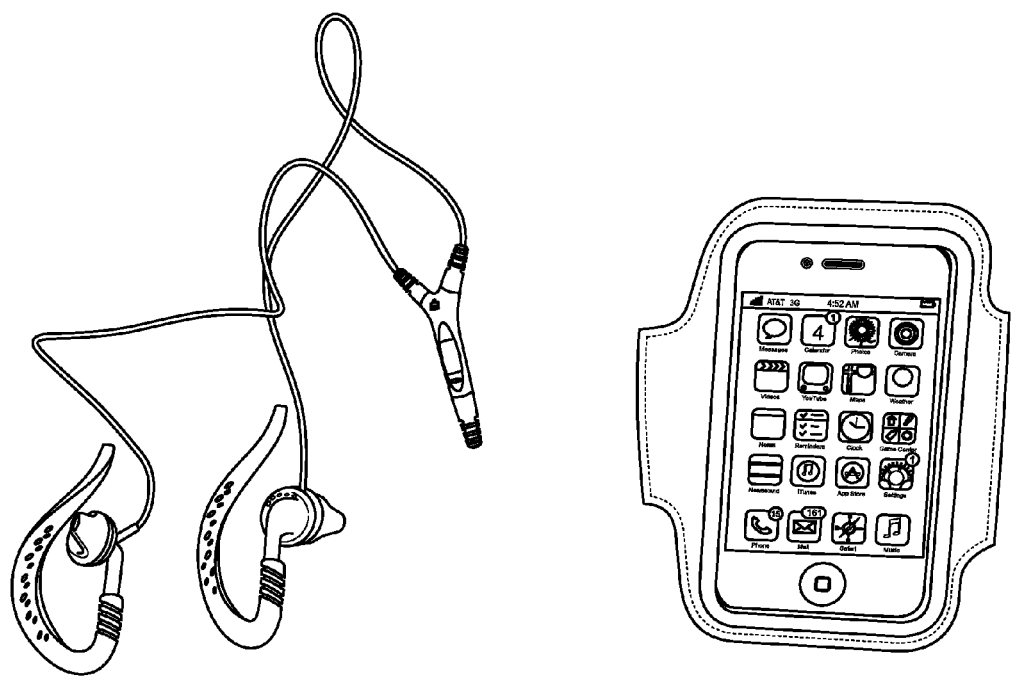
FIG. 7 is a schematic view of the wirelessly linked personal sound system in an arm band.

In another exemplary display shown in FIG. 5, a plurality of indicators 56, are provided for a plurality of frequency ranges. The user can select a frequency range by pressing the center position 40 of the switch 36. The selected frequency range can be indicated, for example, by highlighting slider 58 of the indicator or with a box 60 of the band label (e.g., the 32 band in FIG. 5). Pressing the "up" position 38 or the "down" position 42 of the switch 36 increases or decreases the level of selected frequency band, which is shown both by the slide 58 on the indicator 56. As also shown in FIG. 5, the display may also include a window 62, indicating a preset. The user reaches the window by pressing the center position 40 of the switch 36 to toggle through the ten adjustable frequency ranges to reach the window, which is highlighted in some fashion for the user. The user can then press the "up" position 38 or the "down" position 42 of the switch 36 to scroll through the various presets, for example, "classic", "rock", "jazz", and "heavy metal". Selecting a preset causes the indicators 56 to adjust to the settings for the selected preset. Similarly, modifying the settings for a preset causes the window 62 to go blank.

Figure 3:
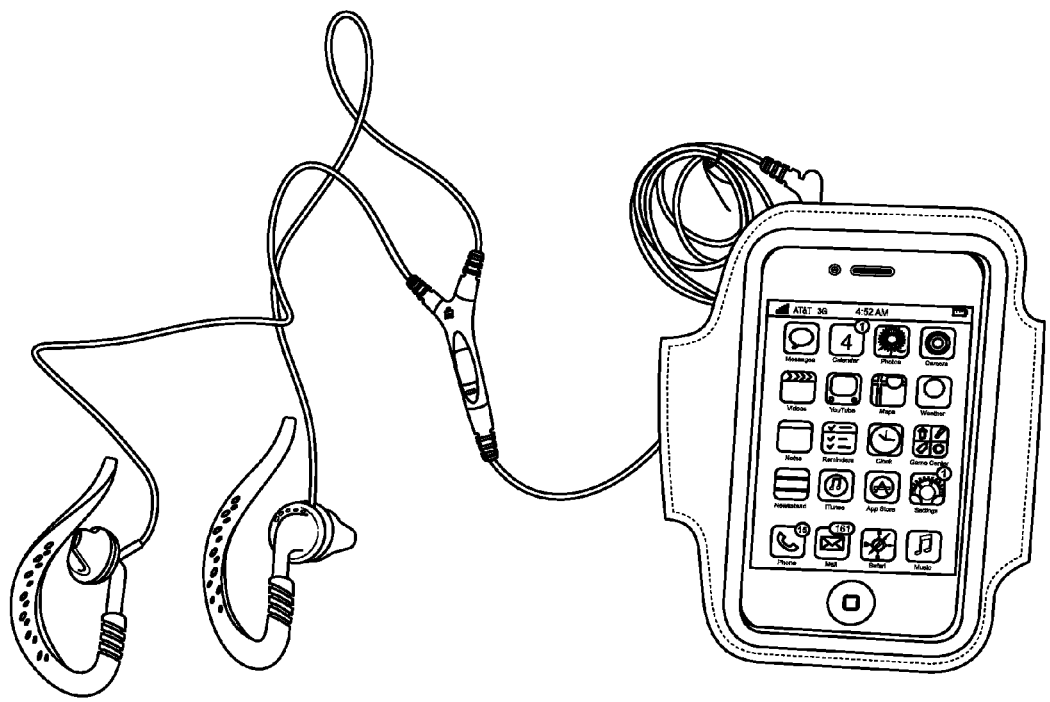
FIG. 3 is a schematic view of the personal sound system in an arm band.

In some embodiments, instead of, or in addition to a visual display, operation of the control 32 causes the portable electronic device 22 to generate an audible signal cuing the user to the adjustment being made, without need to refer to the device display. This is particularly helpful in systems for active users, who may not be able to see the display while making adjustments. For example, many users will secure the portable electronic device 22 in an arm band (see FIG. 3) or a pocket. Thus, operating the center position 40 of the switch 36, generates a wireless signal from the control 32 to the portable electronic device 22. This signal causes a program (app) running on the portable electronic device 22 to change the signal property that the user can adjust, for example from "volume" mode to "treble" mode. This change is preferably accompanied by an audible cue to the user, which may be something as simple as a tone, or it could be a stored or generated verbal signal, such as the spoken word "treble". Operating the center position 40 of the switch 36, generates a wireless signal from the control 32 to the portable electronic device 22. This signal causes a program (app) running on the portable electronic device 22 to change the signal property that the user can adjust, for example, from "treble" mode to "bass" mode. This change is preferably accompanied by an audible cue to the user, which may be something as simple as a tone, or it could be a stored or generated verbal signal, such as the spoken word "bass". These audible cues can be added to the signal provided to the audio output 24. Alternatively, the program (app) can generate a wireless signal to the control 32 that either contains the audible cue, or triggers the generation or play of the audible cue.

The audible cues allow the user to make adjustments to the play back, without having to see the portable electronic device 22. In the case of multiple adjustable frequency bands, the audible cue could be a tone in the frequency range, or more preferably the verbalization of the frequency range. When the user is selecting one of the preset modes, the audible cue can be a tone or it can be verbalization of the name of the present, for example, "classical", "jazz", "rock", "heavy metal", "custom one", and "custom two".

Alternatively, or in addition, the control 32 can include a microphone 41 which can pick up verbal commands spoken by the user. The control 32 can either transmit the verbal signal wirelessly to the program (app) running on the portable electronic device 22, which processes them to decode them. Alternatively, the control 32 can preprocess the verbal signal and wirelessly transmit a corresponding non-verbal signal to the program (app) running on the portable electronic device 22.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A personal sound system comprising:
    a portable electronic device that provides an analog audio signal to an audio output;
    an earphone system connected by wire to the audio output of the portable electronic device, the earphone system including at least one earphone speaker; and
    at least one control associated with the earphone system, the at least one control wirelessly linked to the portable electronic device and including at least one depressible switch, wherein the at least one depressible switch is configured to trigger a transmission of instructions to the portable electronic device to modify the analog audio signal received from the portable electronic device by selecting a preset balance specific to a musical genre to be applied to frequency components of the analog audio signal and providing the modified analog audio signal to the earphone system.

2. The personal sound system according to claim 1, wherein the portable electronic device includes a display displaying indicators of a frequency balance between the frequency components of the analog audio signal provided to the audio output.

3. The personal sound system according to claim 2, wherein the display updates to reflect changes in the frequency balance between the frequency components of the analog audio signal provided to the audio output effected by the at least one control.

4. The personal sound system according to claim 1, wherein the at least one control communicates wirelessly with the portable electronic device using a Bluetooth® protocol.

5. The personal sound system according to claim 1, wherein the at least one control is configured to strengthen or weaken a band of high frequencies, and a control to strengthen or weaken a band of low frequencies.

6. The personal sound system according to claim 1, wherein the at least one control is configured to select one of a plurality of bands of frequencies to adjust.

7. The personal sound system according to claim 1, wherein the at least one control controls a program running on the portable electronic device.

8. A personal sound system comprising:
a control device arranged between and in communication with each of a portable electronic device and an earphone system, the portable electronic device configured to provide an audio signal;
the control device including at least one depressible switch configured to transmit instructions to the portable electronic device to modify the audio signal, the depressible switch including a center position and at least one up position and down position, wherein depressions of the switch at the center position is configured to toggle between a plurality of sound properties and wherein depressions of the switch at the up position and down position are configured to adjust a current sound property as selected at the center position.

9. The personal sound system according to claim 8, wherein the control device is configured to select among a plurality of preset balances of two or more frequency components of the audio signal.

10. The personal sound system according to claim 9, wherein the portable electronic device includes a display displaying indicators of a frequency balance between two or more frequency components of the audio signal.

11. The personal sound system according to claim 10, wherein the display updates to reflect changes in the frequency balance between two or more frequency components of the audio signal provided to an audio output effected by the at least one control.

12. The personal sound system according to claim 8, wherein the at least one control communicates wirelessly with the portable electronic device using a Bluetooth® protocol.

13. The personal sound system according to claim 8, wherein the at least one control comprises a control for strengthening or weakening a band of high frequencies, and a control for strengthening or weakening a band of low frequencies.

14. The personal sound system according to claim 8, wherein the at least one control comprises a control for selecting one of a plurality of bands of frequencies to adjust, and a control for strengthening or weakening the selected band of frequencies.

15. The personal sound system according to claim 8, wherein the at least one control controls a program running on the portable electronic device.

16. The personal sound system according to claim 8, wherein the sound properties included at least one of a treble, bass, and volume.

17. The personal sound system according to claim 8, wherein the control device recognizes a default sound property.

18. The personal sound system according to claim 17, wherein the up position and down position of the depressible switch are configured to control the default sound property in response to the control device not recognizing a depression at the center position for a predetermined amount of time.

19. The personal sounds system according to claim 17, wherein the default sound property is audio signal volume.

20. The personal sound system according to claim 8, wherein the sound property includes a preset mode, the control device configured to apply a preset balance specific to a musical genre as selected by depressions at least one of the up position and down position.

* * * * *